United States Patent [19]
Takimoto

[11] Patent Number: 5,612,660
[45] Date of Patent: Mar. 18, 1997

[54] INDUCTANCE ELEMENT

[75] Inventor: Hiroyuki Takimoto, Kanagawa-ken, Japan

[73] Assignee: Canon Kabushiki Kaisha, Tokyo, Japan

[21] Appl. No.: 504,417

[22] Filed: Jul. 20, 1995

[30] Foreign Application Priority Data

Jul. 27, 1994 [JP] Japan ................................. 6-175168

[51] Int. Cl.⁶ ............................................. H01F 27/30
[52] U.S. Cl. ...................... 336/200; 336/223; 336/232
[58] Field of Search .................................. 336/200, 223, 336/225, 232

[56] References Cited

U.S. PATENT DOCUMENTS 4,975,671  12/1990  Dirks ........................................ 336/223
5,191,699   3/1993  Ganslmeier et al. ..................... 336/200

*Primary Examiner*—Thomas J. Kozma
*Attorney, Agent, or Firm*—Fitzpatrick, Cella, Harper & Scinto

[57] ABSTRACT

In an inductance element which is built in a printed circuit board by forming at least two upper and lower layers of conductive patterns in such a way as to sandwich an insulator layer of the printed circuit board in between them and by interconnecting them by means of through holes (via holes), the inductance element is formed, within a plane orthogonally intersecting the surface of the printed circuit board, in a shape of a rectangularly spiral conductor having at its center an axis parallel to the surface of the printed circuit board. This arrangement enables the inductance element to be formed at the same time as when other conductive patterns of the printed circuit board are formed.

6 Claims, 4 Drawing Sheets

INDUCTANCE ELEMENT

BACKGROUND OF THE INVENTION

1. Field of the Invention

This invention relates to an inductance element arranged to be built n a printed circuit board and more particularly to an inductance element which is usable also as noise-radiation preventing means for preventing a high frequency noise generated by a semiconductor device mounted on a printed circuit board from radiating around the printed circuit board.

2. Description of the Related Art

The recent advancement of technology for the manufacture of semiconductors has come to permit the manufacture of large-capacity memories which are accessible at a high speed and high-precision A/D converters which are capable of operating at a high speed. As a result, it has rapidly become popular to change internal signal processing circuits of electronic apparatuses from the conventional analog circuits to digital circuits.

When a signal processing circuit is digitized, the necessary numbers of logic gates and transistors increase very much from the numbers required for an analog circuit. Besides, since the frequencies of signals to be processed also become higher, there arises a high frequency noise over a wide band due to the switching actions of many transistors and logic gates arranged within semiconductor devices which form the signal processing circuit. The noise propagates to a signal transmitting cable (an interfacing cable) through the connection pin of the semiconductor device and the wiring of an electronic circuit board. Then, the noise radiates around the cable, with the cable acting as an antenna, to hinder the actions of other electronic apparatuses by intruding into their circuits. It is also known that such a noise tends to affect an electromagnetic environment by hindering wireless communication around it. To prevent such a trouble, advanced countries such as the U.S.A., etc., have recently put in force some legal regulations against noises generated by electronic apparatuses. In compliance with the legal regulations, therefore, recent electronic apparatuses are provided with some electronic parts that prevent such a noise from radiating. These noise-radiation preventing parts are known by the name of EMI filters. These EMI filters include a part which consists of a combination of a coil, i.e., an inductance element, and a capacitor (LC filter); a part which is formed solely with an inductance element; and a part which is formed solely with a capacitor.

Referring to FIG. 6, known choke coils 61 and 62 which have two rows of insertion pins corresponding to a DIP (dual in-line package) type semiconductor device are arranged to be mounted on a lead-through (lead-or pin-inserting) mount type circuit board 64. The choke coil can be used not only as an ordinary circuit element but also as a noise-radiation preventing part. FIG. 6 further shows a chip inductor or a chip LC filter 63 or the like which is arranged to be mounted on a circuit board 64 of a surface-mount type, i.e., an SMT (surface mount technology) type. These parts have been used not only as ordinary circuit elements but also as noise-radiation preventing parts.

In a case where the known electronic parts shown in FIG. 6 are to be used as noise-radiation preventing parts, they are normally mounted on an electronic circuit board (a printed circuit board) 64 in the neighborhood of signal cable connection terminals.

Reflecting the technological trend mentioned above, image recording apparatuses such as video cameras have recently come to have their internal signal processing circuits digitized. Further, as a result of advancement of signal compressing technology, some of the currently marketed products have their video signal processing circuits arranged as digital circuits, such as digital signal processors (DSP), instead of conventional analog circuits. With a circuit which has conventionally been arranged in analog circuit thus digitized, the high frequency noise generated inside of a semiconductor device increases to endanger an electromagnetic environment around it as mentioned above. Then, the probability of violating the above-stated legal regulations of advanced countries also becomes high. In order to conform to the legal regulations, the noise radiation must be effectively prevented with some noise-radiation preventing part used for the manufacture of a product which never aggravates the electromagnetic environment around it.

In order to most effectively prevent the noise radiation, it is preferable to mount the noise-radiation preventing part in a position adjacent to a semiconductor device which includes the digital signal processing circuit, i.e., in a position where the noise-radiation preventing part can be connected directly to a connection pin or a connection lead wire protruding from the package of the semiconductor device.

However, since it is essential for designing a portable apparatus such as a video camera or the like to reduce its size and weight as well as to increase its functions, the electronic circuit board 64 mounted on the apparatus is also arranged in a reduced size. As a result, electronic parts are very densely arranged on the circuit board 64 and thus leaves a very little room for mounting the noise-radiation preventing part. Further, in these days, a semiconductor device which is composed of an IC, an LSI, etc., and has a high rate of integration includes therein numerous logic gates and transistors. A large number of connection pins, therefore, protrude from its package with very narrow spacing among them. Besides, these pins are very thin. It is, therefore, impossible to have a sufficient number of noise-radiation preventing parts mounted on the circuit board 64. Any attempt to mount these noise-radiation preventing parts on the circuit board 64 would necessitate a great increase in size of the circuit board 64 and thus would eventually increase the size and weight of the apparatus against its basic design policy.

SUMMARY OF THE INVENTION:

This invention is directed to the solution of the problem mentioned in the foregoing. It is, therefore, an object of this invention to provide an inductance element which can be set in the neighborhood of a part mounted on a circuit board without incurring any increase in size and weight of the circuit board and those of an apparatus on which the circuit board is mounted.

It is another object of this invention to provide an inductance element formed as a rectangularly spiral conductor having at a center thereof an axis parallel to a surface of a circuit board within a vertical plane orthogonally intersecting the surface of the circuit board.

It is a further object of this invention to provide an inductance element formed in a shape of a spiral conductor in which an uppermost horizontal conductive pattern is arranged to be connected directly to a connection lead wire of a surface-mount type part mounted on a circuit board.

These and other objects and features of this invention will become apparent from the following detailed description of embodiments thereof taken in connection with the accompanying drawings.

DETAILED DESCRIPTION OF THE PREFERRED EMBODIMENTS

Some of preferred embodiments of this invention are described below with reference to the drawings.

First Embodiment

Figure 1:
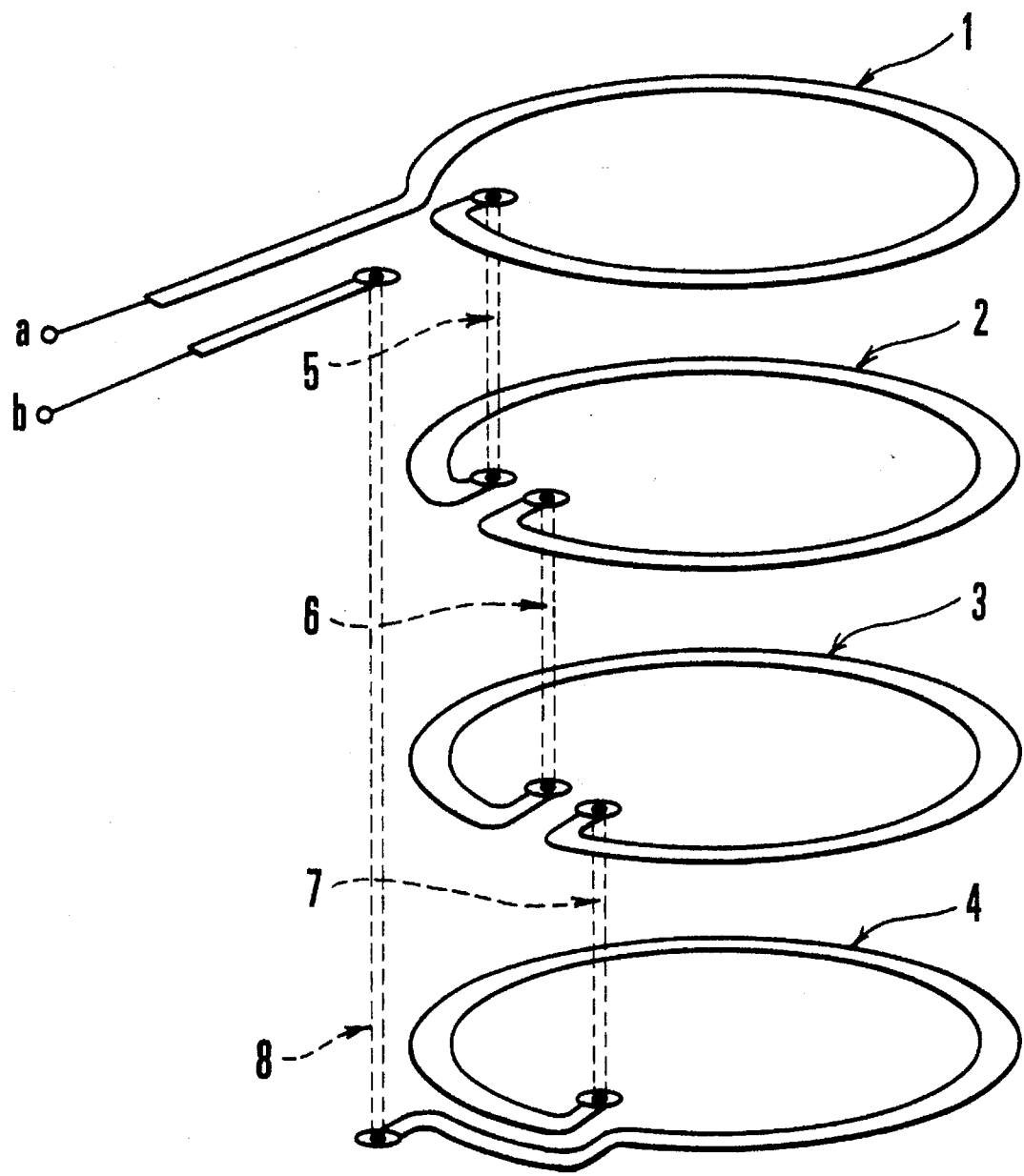
FIG. 1 shows the arrangement of an inductance element which is a first embodiment of this invention.

FIG. 1 schematically shows an inductance element arranged as a first embodiment of this invention. A printed circuit board on which the inductance element is to be mounted, an insulator layer formed on the printed circuit board, etc., are all omitted from the drawing.

The printed circuit board which is not shown is formed by laminating first to fourth insulator layers. A conductive circuit is formed on each of the insulator layers. For these conductive circuits, ring-shaped conductive patterns 1 to 4 which are of the same radius are formed during the process of forming a printed wiring on the printed circuit board, in such a way as to have their centers on one and the same vertical (perpendicular) axis, as shown in the drawing. These conductive patterns are formed either immediately below the mounting position of a semiconductor device which is not shown or very near to the mounting position and are connected to one another by through holes (via holes) 5, 6 and 7 formed respectively in the insulator layers. A spiral conductor which has the perpendicular axis at its center is formed jointly by the conductive patterns 1 to 4 and the through holes 5 to 7. When a current is allowed to flow through the spiral conductor, the spiral conductor acts as an inductance element.

One end of the rounded part of the lowermost conductive pattern 4 is connected to a through hole 8 which pierces through each of the insulator layers to reach the level of the conductive pattern 1. The through hole 8 is connected to a connection terminal "b" via a drawn-out pattern formed at the same level as the conductive pattern 1. One end of the rounded part of the uppermost conductive pattern 1 is connected to a connection terminal "a" via a drawn-out pattern which is at the same level as the conductive pattern 1. When either the connection terminal "a" or the connection terminal "b" is connected to a connection pin or connection lead wire of a semiconductor device which is not shown, the inductance element is connected directly to the semiconductor device as a noise-radiation preventing part. Further, the through holes 5 to 8 are formed by a known process such as photo-etching work on the insulator layers during the process of forming the conductive patterns.

The arrangement of the first embodiment enables the inductance element to be formed at the same time as when other conductive patterns of the printed circuit board are formed. Therefore, unlike the conventional inductance element which has been mounted as a discrete member, the embodiment obviates the necessity of mounting a discrete inductance element. The arrangement not only prevents the size of the circuit board from increasing but also enables the inductance element to be connected, for example, directly to a connection terminal (pin) of a semiconductor device on the circuit board as a noise-radiation preventing member.

Further, since the inductance element can be formed within a very small area immediately below a connection lead wire of a part mounted on the printed circuit board, the size of the printed circuit board is further effectively prevented from increasing.

Second Embodiment

Figure 2:
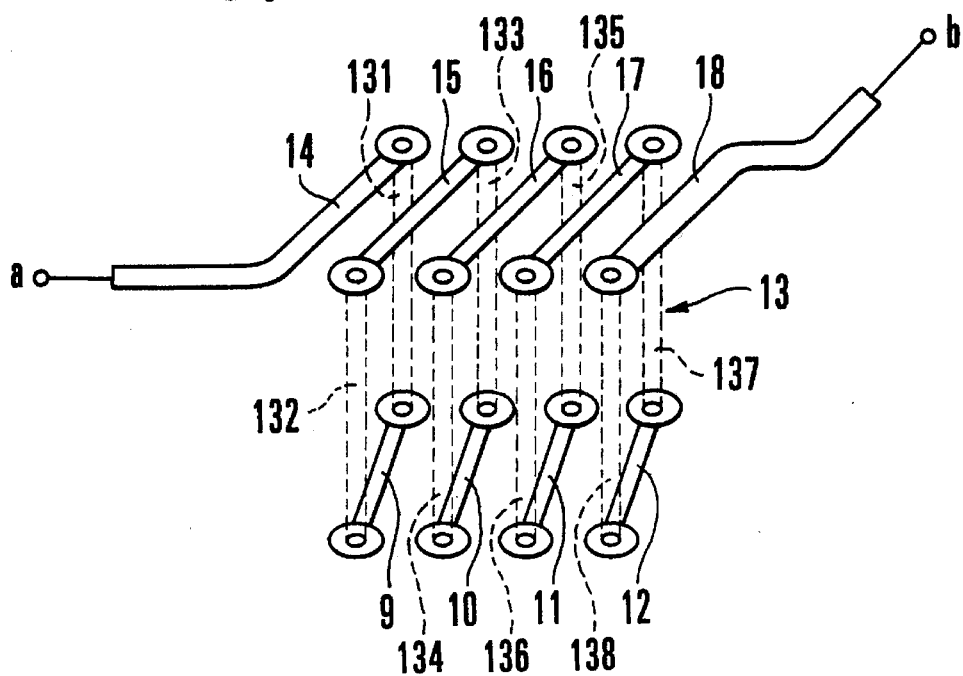
FIG. 2 shows the arrangement of an inductance element which is a second embodiment of this invention.

FIG. 2 shows an inductance element which is arranged as a second embodiment of this invention. In the case of the second embodiment, the inductance element is arranged to be highly advantageous for a nonmultiple-layer electronic circuit board or a double-sided mount type circuit board. In the following description, the embodiment is described on the assumption that the embodiment is applied to a printed circuit board which is of a single-sided mount type.

Referring to FIG. 2, linear conductive patterns 9 to 12 are formed in parallel with each other in conductive circuits on a printed circuit board which is not shown. An insulator layer 13 is formed over the conductive patterns 9 to 12. Linear conductive patterns 14 to 18 are formed in parallel with each other on the conductive circuits of the insulator layer 13. Through holes (via holes) 131 to 138 are formed in the insulator layer 13 in such a way as to connect the conductive patterns 9 to 12 respectively to the conductive patterns 14 to 18. The two groups of conductive patterns which are arranged above and below the insulator layer 13 are connected by the through holes in the following manner:

One end of the conductive pattern 14 is located immediately above one end of the conductive pattern 9. These ends of two conductive patterns 14 and 9 are connected to each other by the through hole 131. The other end of the conductive pattern 9 and one end of the conductive pattern 15 are located on one and the same vertical line and interconnected by the through hole 132. The other end of the conductive pattern 15 and one end of the conductive pattern 10 are located on one and the same vertical line and the two conductive patterns 15 and 10 are interconnected by the through hole 133. The ends of other conductive patterns are also interconnected in the same manner. In other words, the other end of the conductive pattern 10 and one end of the conductive pattern 16 are interconnected by the through hole 134. The other end of the conductive pattern 16 is connected to one end of the conductive pattern 11 by the through hole 135. The other end of the conductive pattern 11 is connected to one end of the conductive pattern 17 by the through hole 136. The other end of the conductive pattern 17 is connected to one end of the conductive pattern 12 by the through hole 137. The other end of the conductive pattern 12 is connected to one end of the conductive pattern 18 by the through hole 138. These groups of conductive patterns and the through holes jointly form an inductance element which is composed of a rectangularly spiral conductor having at its center an axis extending in parallel to the surface of the printed circuit board.

Among the upper group of conductive patterns, the conductive patterns 14 and 18 which are disposed at two ends of the group are connected respectively to connection terminals "a" and "b". One of the two connection terminals is connected to a connection pin or a lead wire of a semiconductor device which is not shown but is mounted on the printed circuit board. Therefore, a high frequency noise generated by the semiconductor device is blocked and prevented by the inductance element from being transmitted to an interface cable, etc., which are arranged at the circuit board. The inductance element thus effectively prevents the high frequency noise from being radiated to an outside environment.

According to the arrangement of the second embodiment, the inductance element can be formed at the same time as when other conductive patterns of the printed circuit board are formed. Therefore, unlike the conventional arrangement, it is not necessary to mount an inductance element on the circuit board as a discrete part. The size of the circuit board thus can be prevented from increasing. The inductance element can be connected as a noise-radiation preventing part, for example, directly to the connection lead wire of a semiconductor device mounted on the circuit board. Further, in accordance with the arrangement of the second embodiment, an inductance element can be advantageously arranged for a circuit board having a single insulator layer or for a double-sided mount type circuit board.

Third Embodiment

Figure 3:
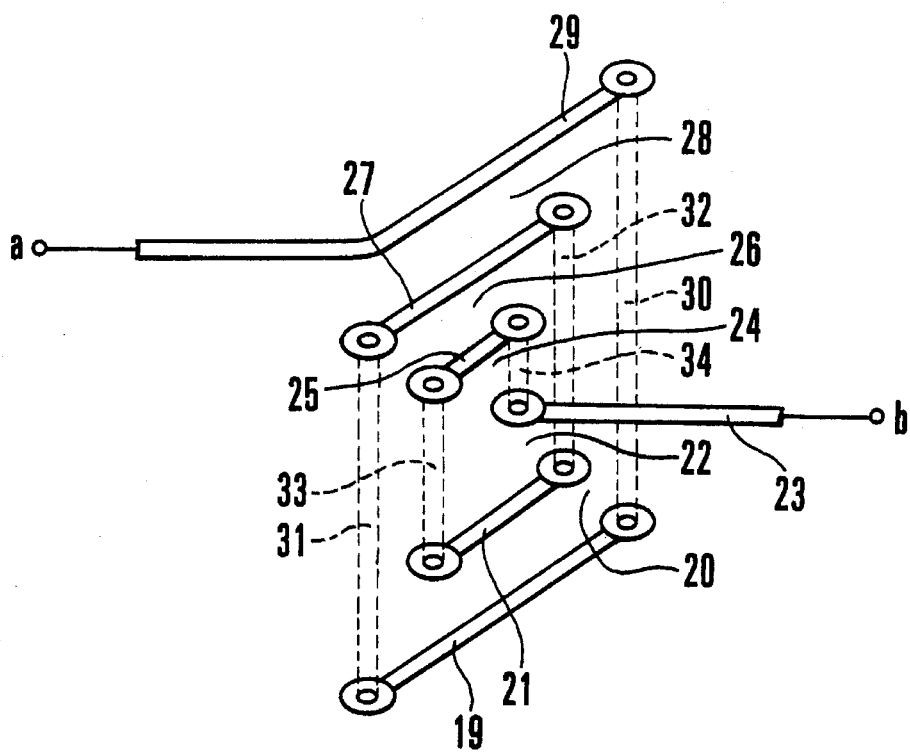
FIG. 3 shows the arrangement of an inductance element which is a third embodiment of this invention.

FIG. 3 shows an inductance element which is arranged as a third embodiment of this invention. This inductance element is formed within a plane extending perpendicular to the surface of a printed circuit board which is not shown. Referring to FIG. 3, a conductive pattern 19 of a lowermost conductive circuit is formed on a insulator layer which is not shown. An insulator layer 20 is disposed above the conductive pattern 19. A conductive pattern 21 of a conductive circuit is formed on the insulator layer 20. An insulator layer 22 is disposed above the conductive pattern 21. A conductive pattern 23 of a conductive circuit is formed on the insulator layer 22. An insulator layer 24 is disposed above the conductive pattern 23. A conductive pattern 25 of a conductive circuit is formed on the insulator layer 24. An insulator layer 26 is disposed above the conductive pattern 25. A conductive pattern 27 of a conductive circuit is formed on the insulator layer 26. An insulator layer 28 is disposed above the conductive pattern 27. A conductive pattern 29 of a conductive circuit is formed on the insulator layer 28. A through hole (via hole) 30 is formed in the insulator layers and arranged to connect one end of the conductive pattern 29 to one end of the conductive pattern 19. A through hole 31 is arranged to connect the other end of the conductive pattern 19 to one end of the conductive pattern 27. A through hole 32 is arranged to connect the other end of the conductive pattern 27 to one end of the conductive pattern 21. A through hole 33 is arranged to connect the other end of the conductive pattern 21 to one end of the conductive pattern 25. A through hole 34 is arranged to connect the other end of the conductive pattern 25 to one end of the conductive pattern 23. The conductive pattern 29 which is on an uppermost layer is exposed to the outside and is provided with a terminal "a", which is soldered to a connection lead wire of a semiconductor device which is not shown. The conductive pattern 23 is connected to an external cable through a connection terminal "b".

Since the inductance element of this embodiment is formed within a plane extending perpendicular to the surface of the printed circuity board, an area required for arranging the inductance element is very small. Therefore, the inductance element can be connected to the connection lead wires of a semiconductor which has a high rate of integration and thus has its connection lead wires (connection pins) vary narrowly spaced. Besides, the area of the printed circuit board can be much reduced.

In accordance with the arrangement of the third embodiment, the inductance element can be formed at the same time as when other conductive patterns of the printed circuit board are formed. Hence, unlike the conventional arrangement, it is not necessary to mount an inductance element as a discrete part. Therefore, the size of the circuit board can be prevented from increasing. The inductance element can be connected as a noise-radiation preventing part, for example, directly to the connection terminal (pin) of a semiconductor device mounted on the circuit board. Further, in accordance with the arrangement of the third embodiment of this invention, the inductance element can be installed within a vary small area almost immediately below the connection lead wire of a semiconductor device mounted on the circuit board.

Fourth Embodiment

Figure 4:
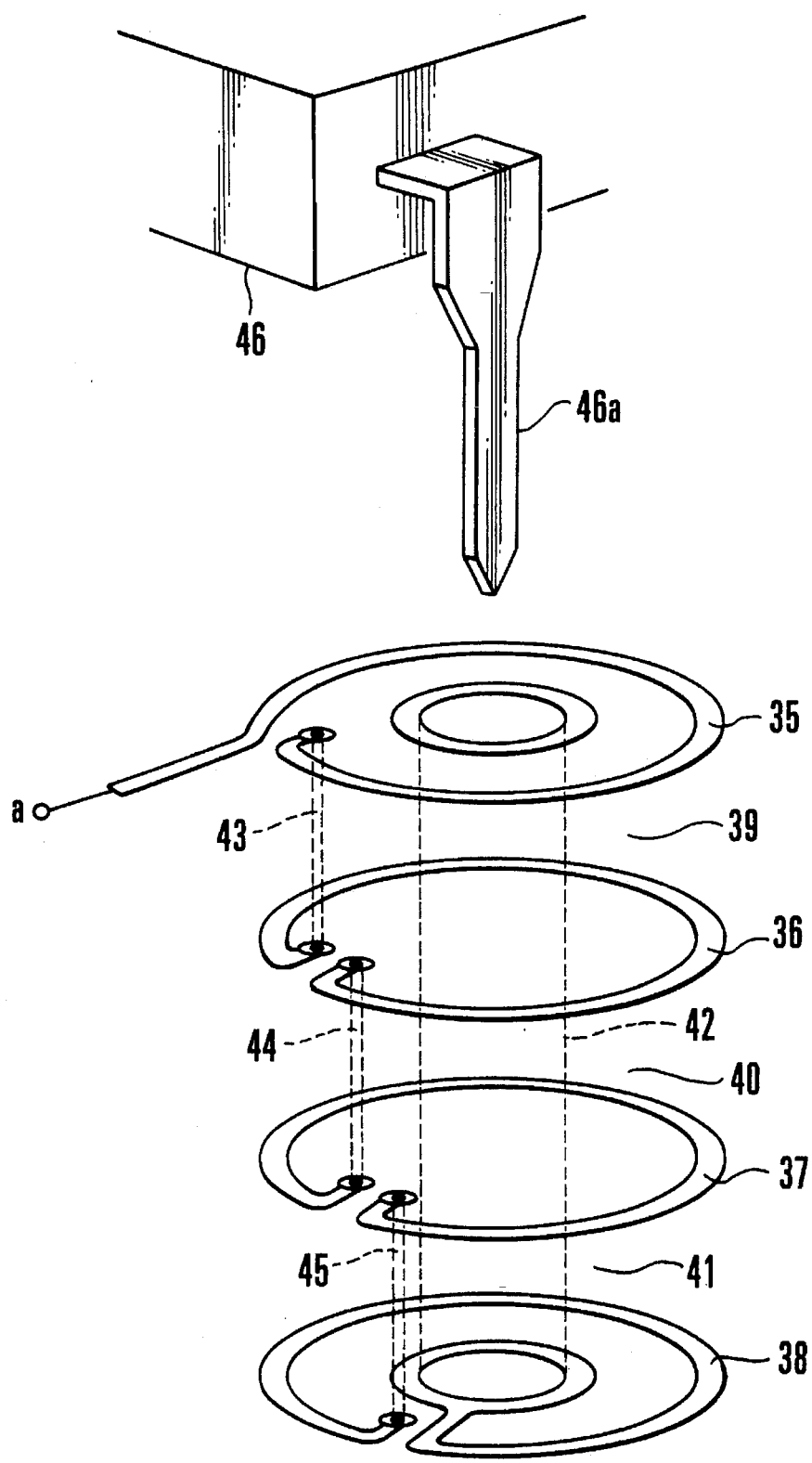
FIG. 4 shows the arrangement of an inductance element which is a fourth embodiment of this invention.

FIG. 4 shows a fourth embodiment of this invention. The fourth embodiment represents an example of an inductance element to be built in the conventional printed circuit board of a type called a lead-through (pin-inserting) type. Referring to FIG. 4, an uppermost conductive pattern 35 of a conductive circuit is formed on the surface of a printed circuit board which is not shown. A conductive pattern 36 of a conductive circuit is formed below the conductive pattern 35 through an insulator layer 39. A conductive pattern 37 of a conductive circuit is formed below the conductive pattern 36 through an insulator layer 40. A conductive pattern 38 of a conductive circuit is formed below the conductive pattern 37 through an insulator layer 41. A through hole (via hole) 43 is formed in the insulator layer 39 and arranged to connect one end of the conductive pattern 35 to one end of the conductive pattern 36. A through hole (via hole) 44 is formed in the insulation layer 40 and arranged to connect the other end of the conductive pattern 36 to one of the conductive pattern 37. A through hole (via hole) 45 is formed in the insulator layer 41 and arranged to connect the other end of the conductive pattern 37 to one end of the conductive pattern 38. A pin-inserting through hole 42 is arranged for inserting a connection pin 46a of a pin-inserting type semiconductor device 46 which is mounted on the circuit board. The other end of the lowermost conductive pattern 38 is connected to a solder face on the inner wall of the pin-inserting through hole 42. When the semiconductor device 46 is mounted on the circuit board with the connection pin 46a inserted into the through hole 42, the inductance element of this embodiment is connected to the connection pin 46a as a noise-radiation preventing part.

The arrangement of the fourth embodiment is applicable to the conventional lead-through type (lead-inserting type) printed circuit board. Therefore, the inductance element can be advantageously used for an electronic circuit board of this type without increasing the size of the circuit board.

Fifth Embodiment

Figure 5:
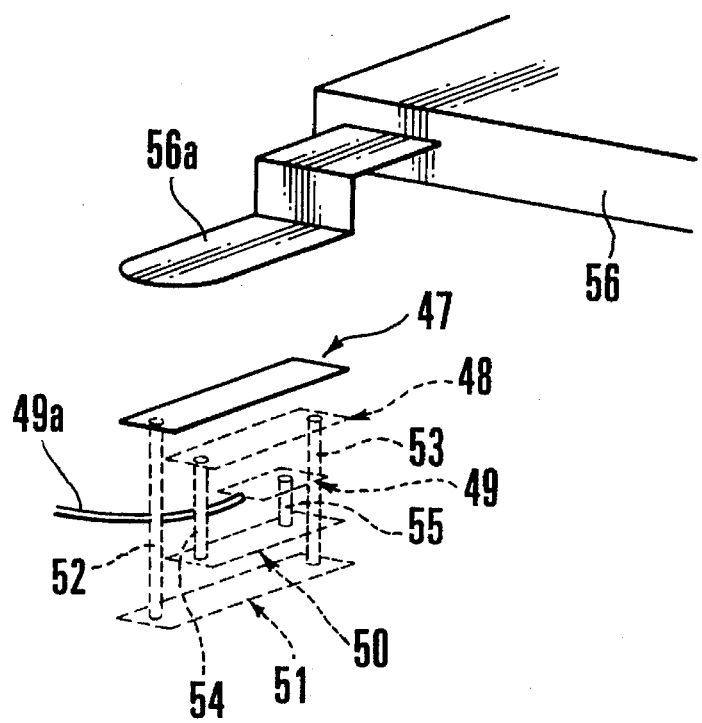
FIG. 5 shows the arrangement of an inductance element which is a fifth embodiment of this invention.
Figure 6:
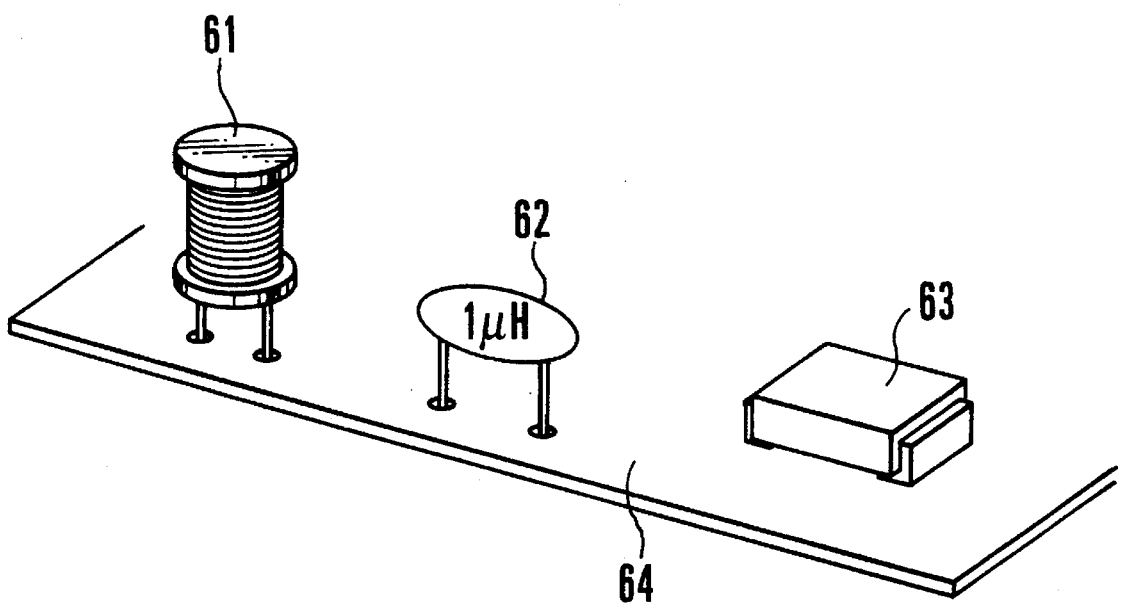
FIG. 6 shows the arrangement of the conventional noise-radiation preventing electronic parts.

FIG. 5 shows a fifth embodiment of this invention. The inductance element of this embodiment is arranged in about the same manner as the inductance element shown in FIG. 3. In other words, the inductance element applies to a printed circuit board of the surface mount (SMT) type. Referring to FIG. 5, an uppermost conductive pattern 47 of a conductive circuit is formed on the surface of a printed circuit board which is not shown. The conductive pattern 47 has a connection lead wire 56a of a surface-mount type semiconductor device 56 soldered directly to it. Conductive patterns 48 to 51 of conductive circuits are formed in the same vertical position within the printed circuit board respectively through insulator layers. An external connection terminal 49a is drawn out from the conductive pattern 49 which is located in an intermediate position. A through hole (via hole) 52 is formed in the insulator layers of the printed circuit board and arranged to interconnect the conductive patterns 47 and 51. A through hole (via hole) 53 is arranged to interconnect the conductive patterns 51 and 48. A through hole (via hole) 54 is arranged to interconnect the conductive patterns 48 and 50. A through hole (via hole) 55 is arranged to interconnect the conductive patterns 50 and 49. These conductive patterns 47 to 51 and these through holes 52 to 55 jointly form a rectangularly spiral conductor which is the inductance element of the fifth embodiment.

The inductance element of this embodiment is also formed within a plane extending perpendicular to the surface of the printed circuit board. The perpendicular arrangement not only permits reduction in necessary area but also permits the inductance element to be disposed immediately below the connection lead wire of the semiconductor device mounted on the circuit board.

The inductance element of the fifth embodiment can be formed at the same time as when other conductive patterns of the printed circuit board are formed. Hence, it is no longer necessary to mount an inductance element as a discrete part like in the case of the convention arrangement. The arrangement of the fifth embodiment not only effectively prevents an increase in size of the circuit board but also permits the inductance element to be connected, for example, directly to the connection lead wire of a semiconductor device mounted on the circuit board as a noise-radiation preventing part. In accordance with this invention, the inductance element thus can be connected directly to the connection lead wire of a part mounted on the surface-mount type printed circuit board. Besides, an area required in installing the inductance element is very small.

While the inductance element of each of the embodiments of this invention has been described as arranged to be used as a noise-radiation preventing part, the inductance element according to this invention is of course usable as an ordinary circuit part. In accordance with this invention, a number of necessary parts to be mounted on a circuit board can be reduced and the size of the circuit board also can be reduced.

What is claimed is:

1. An inductance element formed in a multilayer printed circuit board, comprising:

one outer conductive circuit formed on an outer layer on one side of the multilayer printed circuit board, said one outer conductive circuit having a conductive pattern connected to a terminal provided for external connection;

another outer conductive circuit formed on another outer layer on another side of the multilayer printed circuit board, said another outer conductive circuit having a conductive pattern;

a plurality of inner conductive circuits formed respectively on inner layers in the multilayer printed circuit board, said plurality of inner conductive circuits respectively having conductive patterns, and one of said conductive patterns of said plurality of inner conductive circuits being connected to a terminal provided for external connection; and a plurality of insulator layers respectively sandwiched in between adjacent conductive layers between said one outer conductive circuit and said another outer conductive circuit, said plurality of insulator layers provided with a plurality of conductive through holes arranged to interconnect said conductive patterns of said conductive circuits, wherein said plurality of through holes formed in said plurality of insulator layers are arranged in conjunction with said conductive patterns to form a rectangularly spiral conductor within a plane which orthogonally intersects a plane surface of the printed circuit board.

2. An inductance element according to claim 1, wherein said rectangularly spiral conductor is formed to have at a center thereof an axis extending in parallel to the plane surface of the printed circuit board.

3. An inductance element according to claim 1, wherein a terminal for external connection which is connected to a conductive pattern serving as an outer conductor part of said rectangularly spiral conductor is connected directly to a connection lead wire of a surface-mount type part mounted on the printed circuit board.

4. An inductance element formed at a multilayer printed circuit board, comprising:

conductive circuits formed in a plurality of layers on the printed circuit board, said conductive circuits of plural layers respectively having conductive patterns, and two of said conductive circuits having conductive patterns connected to terminals provided for external connection;

a plurality of insulator layers formed at the printed circuit board, each of said plurality of insulator layers being disposed between adjacent conductive circuits; and a plurality of conductive through holes provided in said plurality of insulator layers interconnecting said conductive patterns of said conductive circuits, said plurality of through holes being arranged in conjunction with said conductive patterns to form a rectangularly spiral conductor within a plane orthogonally intersecting a plane surface of the printed circuit board.

5. An inductance element formed at a multilayer printed circuit board, comprising:

a first conductive circuit formed on an outer layer on one side of the printed circuit board, said first conductive circuit having a conductive pattern connected to a terminal for external connection;

a second conductive circuit formed on another outer layer on another side of the printed circuit board, said second conductive circuit having a conductive pattern;

a third conductive circuit formed inside said first conductive circuit, said third conductive circuit having a conductive pattern;

a fourth conductive circuit formed inside said second conductive circuit, said fourth conductive circuit having a conductive pattern;

a fifth conductive circuit formed inside said third conductive circuit, said fifth conductive circuit having a conductive pattern;

a sixth conductive circuit formed between said fourth conductive circuit and said fifth conductive circuit, said sixth conductive circuit having a conductive pattern connected to a terminal provided for external connection;

a plurality of insulator layers each of which is interposed in between said conductive circuits; and a plurality of, conductive through holes provided in said plurality of insulator layers interconnecting said conductive patterns, said plurality of through holes being arranged in conjunction with said conductive patterns to form a rectangularly spiral conductor within a plane which orthogonally intersects a plane surface of the printed circuit board.

6. An inductance element according to claim 5, wherein said plurality of through holes include a first through hole which interconnects the conductive patterns of said first and second conductive circuits, a second through hole which interconnects the conductive patterns of said second and third conductive circuits, a third through hole which interconnects the conductive patterns of said third and fourth conductive circuits, a fourth through hole which interconnects the conductive patterns of said fourth and fifth conductive circuits, and a fifth through hole which interconnects the conductive patterns of said fifth and sixth conductive circuits.

* * * * *

UNITED STATES PATENT AND TRADEMARK OFFICE
CERTIFICATE OF CORRECTION

PATENT NO. : 5,612,660
DATED : March 18, 1997
INVENTOR(S) : HIROYUKI TAKIMOTO

It is certified that error appears in the above-identified patent and that said Letters Patent is hereby corrected as shown below:

COLUMN 1

Line 6, "n" should read --in--.

COLUMN 9

Line 6, "of," should read --of--.

Signed and Sealed this

Nineteenth Day of August, 1997

*Attest:*

BRUCE LEHMAN

*Attesting Officer*　　*Commissioner of Patents and Trademarks*